(12) United States Patent
Suzuki et al.

(10) Patent No.: US 6,346,475 B1
(45) Date of Patent: Feb. 12, 2002

(54) METHOD OF MANUFACTURING SEMICONDUCTOR INTEGRATED CIRCUIT

(75) Inventors: Yoichi Suzuki; Naoki Oka, both of Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/689,838

(22) Filed: Oct. 13, 2000

(30) Foreign Application Priority Data

Oct. 13, 1999 (JP) .......................................... 11-291146

(51) Int. Cl.[7] .................. H01L 21/4763; H01L 21/302; H01L 21/461

(52) U.S. Cl. ...................... 438/637; 438/622; 438/634; 438/740

(58) Field of Search ................................ 438/228, 618, 438/621, 622, 626, 637, 634, 672, 675, 687, 685, 740, 737, 738

(56) References Cited

U.S. PATENT DOCUMENTS 5,000,818 A * 3/1991 Thomas et al. ............. 156/643
6,046,092 A * 4/2000 Chang et al. ................ 438/396
6,153,490 A * 11/2000 Xing et al. .................. 438/396
6,177,351 B1 * 1/2001 Beratan et al. ............. 438/694
2001/0010961 A1 * 8/2001 Jung et al. ................... 438/279

* cited by examiner

Primary Examiner—Richard Elms
Assistant Examiner—Adam Pyonin
(74) Attorney, Agent, or Firm—McDermott,Will & Emery

(57) ABSTRACT

A silicon nitride film is formed on a substrate so as to cover semiconductor devices. After having formed more than one layer of conducting members and interlayer dielectric portion, such as silicon oxide interlayer films on the silicon nitride film, an opening is formed in said interlayer dielectric portion so as to reach the silicon nitride film. The substrate with thus defined opening is etched in an etching solution containing hydrogen fluoride acid therein to remove away the silicon oxide interlayer portion. As the silicon oxide interlayer portion is etched in the solution, this forms electrical interconnection that are not surrounded with any oxides. As the silicon nitride film works as an etching stopper layer in this etching above, the semiconductor devices are protected against the etching process.

10 Claims, 13 Drawing Sheets

METHOD OF MANUFACTURING SEMICONDUCTOR INTEGRATED CIRCUIT

BACKGROUND OF THE INVENTION

1. Field of the Invention

The present invention relates to a method of manufacturing a semiconductor integrated circuit having electrical wiring layers for interconnecting semiconductor devices.

2. Description of the Related Art

Various attempts have been made to increase the operating speed performance of high density fine semiconductor integrated circuits. In the operating speed of semiconductor integrated circuits, total delay is divided into "Interconnection Delay" and "Intrinsic Gate Delay." "Intrinsic Gate Delay" is caused by gates per se composed of transistors in the semiconductor integrated circuits whereas "Interconnection Delay" is caused by electrical wiring for connecting these transistors with each other. As shown in FIG. 13, the ratio of "Interconnection Delay" to "Intrinsic Gate Delay" is larger when the semiconductor integrated circuits become finer. "Interconnection delay" is affected by the capacitance and electrical resistance of on-chip interconnection.

SUMMARY OF THE INVENTION

As one of known approaches to enhance the performance of operating speed, there is a method of doping fluorine (F) or carbon (C) into an interlayer oxide film to reduce the relative dielectric constant of this interlayer oxide film per se, thereby improving the operation delay of integrated circuits due to the wiring capacitance. It has also been reported that it is effective to lower the density of the interlayer oxide film in order to reduce the relative dielectric constant thereof.

There is another known approach to employ a carbon-based material. The approach comprises the steps of forming a interlayer film and removing away the carbon-based interlayer film with oxygen ($O_2$) plasma process.

There is a still another approach to reduce the effective or "net" relative dielectric constant by providing a gap space within an interlayer film through adequate controlling of process conditions for fabricating the film.

As a result of the inventors' investigation on the operating speed of semiconductor integrated circuits, the inventors have found the following problems.

In order to form fluorine-based oxide films with low dielectric constant, new dedicated chemical vapor deposition (CVD) apparatus is required. This new CVD apparatus is, however, different from the conventional CVD apparatus for use in forming interlayer films. For forming the desired films, the new CVD apparatus requires new precise growth processing conditions for forming films and the maintenance of these conditions. As far as fluorine-based silicon oxides are used for interlayer films, it remains difficult to reduce the relative dielectric constant less than 3.

The above-mentioned method of employing carbon-based material for the interlayer film also requires extra process facility including carbon-based interlayer film forming apparatus and dedicated $O_2$-plasma apparatus.

Furthermore, in the method of forming interlayer films containing gaps or voids therein, it is difficult to precisely maintain the conditions for forming the films in CVD process. This difficulty results in the deviation of the film formation conditions, which in turn leads to chip defects such as short-circuit and breaking of electrical connection. Since these chip defects may occur after long-term use of IC chip products in some cases, this method cannot be used in view of the reliability of semiconductor integrated circuits.

It is, therefore, an object of the present invention to provide a method of manufacturing a semiconductor integrated circuit capable of increasing its operation speed without the use of an additional process apparatus.

The present invention relates to a method of manufacturing a semiconductor integrated circuit having, on a substrate, conductors for electrically connecting semiconductor devices to each other. The substrate has, on its one main surface, a first region and a second region that is different from the first region. This method comprises the steps of: (a)forming a plurality of semiconductor devices on a substrate; (b)forming an etching stopper film on said plurality of semiconductor devices; (c) forming a first conducting portion for connecting said plurality of semiconductor devices with each other; (d) forming, on said etching stopper film, an interlayer dielectric film portion and a second conducting portion for connection of said first conducting portion in said first region, said interlayer dielectric film portion containing silicon oxide; (e) forming an opening in said second region through said interlayer dielectric film portion; and (f) etching said interlayer dielectric film portion having said opening formed therein in an etching solution containing at least hydrogen fluoride acid to remove said interlayer dielectric film portion.

The interlayer film portion includes a silicon-based dielectric film such as silicon oxide film. When the silicon-based interlayer film portion is removed using silicon oxide film dissolvable solution, the etching stopper layer serves as a protective layer against the etching of the silicon-based interlayer film portion. This etching stopper film can protect the semiconductor devices covered therewith against any unwanted etching treatment. Since the opening is formed in the second region that does not have the second conducting portion blocking the opening, the opening can reach the etching stopper film. As the interlayer film is exposed on the inner side surface of the opening, etching process starts from the interlayer film exposed on all the inner side surface of the opening.

The present invention may include one or more process steps as follows.

In the method of manufacturing a semiconductor integrated circuit in accordance with the present invention, step (c) includes the step of (c1) forming contacting conductors that directly connect with said semiconductor devices and wiring conductors. The wiring conductors are connected to the contacting conductors. The first conducting portion includes said contacting conductors and said wiring conductors.

In the method of manufacturing a semiconductor integrated circuit according to the present invention, step (d) includes the step of (d1) forming one or more wiring conductors, a silicon oxide film on each of said wiring conductors and said first conducting portion, and via conductors in said silicon oxide film. The second conducting portion includes said wiring conductors and said via conductors, and the interlayer dielectric film portion includes said silicon oxide film.

In addition, the wiring conductors may contain copper as its main constituent material whereas the via conductors and said contact conductors may contain tungsten as main constituent material thereof.

In the method of manufacturing a semiconductor integrated circuit according to the invention, the second conducting portion in the interlayer dielectric film portion may be formed in a damascene method in step (d). The damascene method indicates a dual-damascene method or a single-damascene method.

According to the damascene methods, the fabrication procedure begins with the step of forming a silicon oxide film provided so as to cover underlying conductors. Then, depressed portions are formed in this silicon oxide film so as to reach the underlying conductors, and other conductors to are formed in these depressed portions. The other conductors may be composed of the via conductors and/or wiring conductors. The depressed portions indicate at least one of first and second depressed portions. The first depressed portions are filled with the via conductors and the second depressed portions are filled with the wiring conductors. These via conductors and wiring conductors may be formed in the same process step.

The second conducting portion may include one or more, conducting levels, each being composed of the wiring conductors and via conductors. The interlayer film portion may include a specific number of silicon-based dielectric layers, the number of which is two times that of the conducting levels. Alternatively, the second conducting portion may include one or more conducting layers, each being composed of wiring conductor portions and via conductor portions.

The interlayer film portion includes one or more silicon-based dielectric layers, the number of which are equal to that of the conducting layers.

In the method of manufacturing a semiconductor integrated circuit in accordance with the present invention, the etching stopper film may be formed over the first conducting portion in step (b). The etching stopper film can protect the first conducting portion provided thereunder from etchant. The first conducting portion may be provided anywhere independently of the location of the opening. Additionally, the first conducting portion disposed under the etching stopper film may be made of material that can be etched in the etchant. The first conducting portion comprises any given number of wiring layers.

In the method of manufacturing a semiconductor integrated circuit according to the present invention, the first conducting portion may be formed in step (c) so as to pass through the etching stopper film and so as to connect the semiconductor devices with each other. This configuration is advantageous to an application that a silicon nitride film is used inherently as the etching stopper film for forming self-align contact structure.

In the method of manufacturing a semiconductor integrated circuit according to the present invention, the substrate may include a plurality of semiconductor chip regions and a scribe region. Each of the plurality of semiconductor chip regions includes semiconductor integrated circuits, and the scribe region is provided so as to surround respective semiconductor chip regions. In the substrate thus arranged, step (e) may comprise the step of forming said opening in the scribe region and/or the semiconductor chip regions.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings that are given by way of illustration only, and thus are not to be considered as limiting the present invention.

FIG. 12 is a plan view corresponding to FIG. 11, wherein FIG. 11 is a cross-sectional view taken along line I—I in FIG. 12.

DESCRIPTION OF THE PREFERRED EMBODIMENTS

Embodiments of the present invention will now be described with reference to the accompanying drawings. In the description below, parts or components identical to each other are designated by the same reference symbols without repeated description.

It should be noted that although the following description is directed to a semiconductor integrated circuit (IC), having metal oxide semiconductor (MOS) devices, to which the present invention can be applied, the invention should not be limited to this semiconductor integrated circuit.

FIGS. 1 to 4 show cross-sectional views in respective process steps according to a first embodiment of the present invention.

Figure 1:
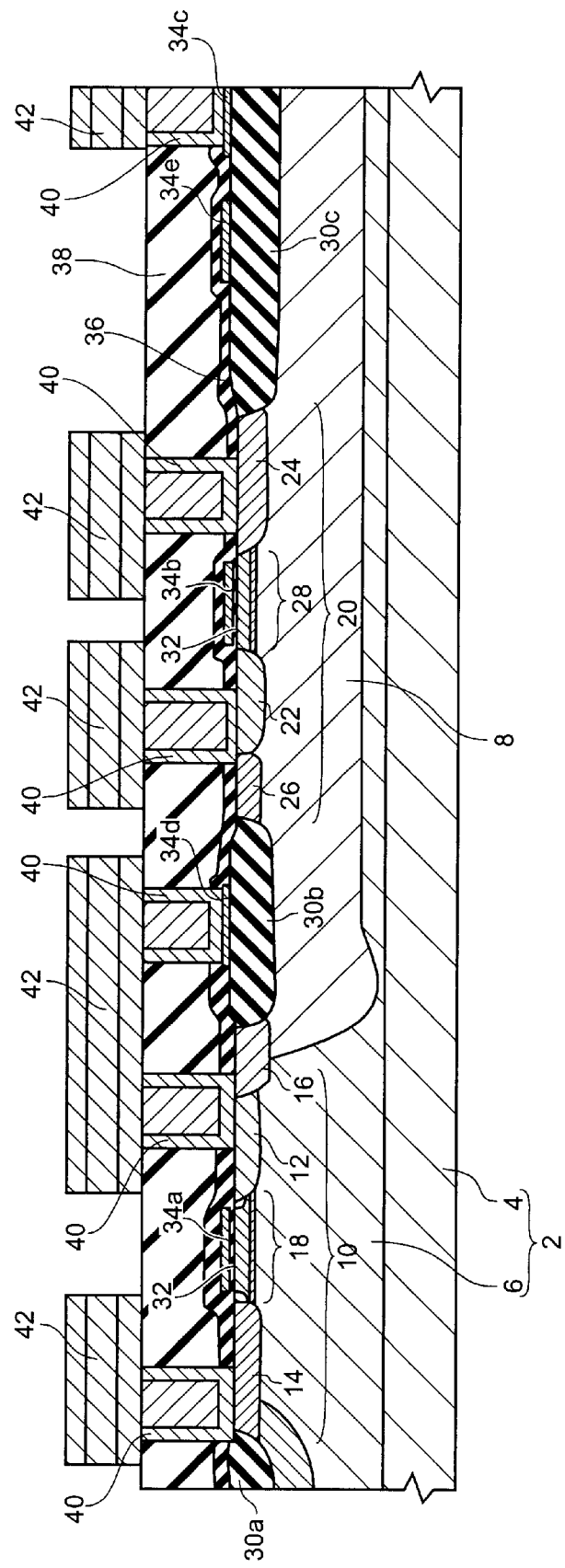
FIGS. 1 to 4 are cross-sectional views in respective process steps for manufacturing a semiconductor integrated circuit in accordance with a first embodiment of the present invention.

Referring to FIG. 1, a substrate 2 has a P type epitaxial layer 6 on a heavily-doped P-type wafer 4. The substrate 2 has an N-channel type MOS device 10 and a P-channel MOS device 20 formed thereon.

The N-channel MOS device 10 is formed on a top surface of the P-type epitaxial layer 6. An N type well region 8 is formed in a region for the P-channel MOS (PMOS) device 20. Then, a device isolation film 30a, 30b, 30c is formed so as to electrically isolate the NMOS device 10 and PMOS device 20 from each other. The device isolation film 30a to 30c is provided to form device forming regions surrounded thereby. The NMOS device 10 is provided between the device isolation film 30a and 30b whereas the PMOS device 20 is provided between the device isolation film 30b and 30c.

A gate insulating film 32 is formed in the device forming regions. Then, gate electrodes 34a to 34e are formed on the gate insulating films 32. Gate electrodes 34a to 34e each have polyside structure. Prior to forming the gate electrodes, impurities for controlling the threshold voltages of the devices are doped in the regions 18, 28 just below the gate electrodes 34a, 34b by ion implantation. After the formation of the gate electrodes 34a and 34b, an N-type source diffusion region 12 and N-type drain diffusion region 14 are formed so as to be self-aligned with the gate electrode 34a, and a P-type source diffusion region 22 and P-type drain diffusion region 24 are formed so as to be self-aligned with the gate electrode 34b.

Subsequently, a first silicon nitride film 36, such as Si₃N₄film, is formed on the substrate 2. The first silicon nitride film 36 is formed, for example, to a predetermined thickness ranging from about 30 to 100 nanometers (nm) by chemical vapor deposition (CVD) technique. The first silicon nitride film 36 is used as an etching stopper film. The first silicon nitride film 36 can also be used as an etching stopper layer for forming self-align contacts.

Then, a first silicon oxide film 38, such as borophosphosilicate glass (BPSG) film is formed on the first silicon nitride film 36. The first silicon oxide film 38 is formed, for example, to a thickness of about 500 to 1,000 nm in CVD methods. Thereafter, contact holes are formed, extending through the first silicon nitride film 36 and first silicon oxide film 38, so as to reach the underlying gate electrodes and the surface of substrate 2. These contact holes are formed using photolithography and dry etching methods, for example. Buried plugs 40, such as tungsten plugs, are formed in thus defined contact holes. Prior to forming such buried W plugs, a TiW film may be formed on the bottom and side surfaces of the respective contact holes. For example, the TiW film may be formed by sputtering whereas the W plugs are formed by CVD. After the formation of the buried plugs 40, the first silicon oxide film 38 and buried plugs 40 are planarized by chemical-mechanical polishing (CMP).

A first wiring layer 42 is formed on thus planarized first silicon oxide film 38. The first wiring layer 42 is composed of a multilayer of three films—e.g. a TiW film, W film and TiW film. This multilayer structure can be obtained in a sequence of process steps of forming the TiW film by sputtering, forming the W film by CVD, and then forming the TiW film by sputtering, and, after forming these films, patterning the resultant multilayer to form desired wiring layer in photolithography and dry etching methods. The first wiring layer 42 has its thickness ranging from 500 to 1,000 nm.

Figure 2:
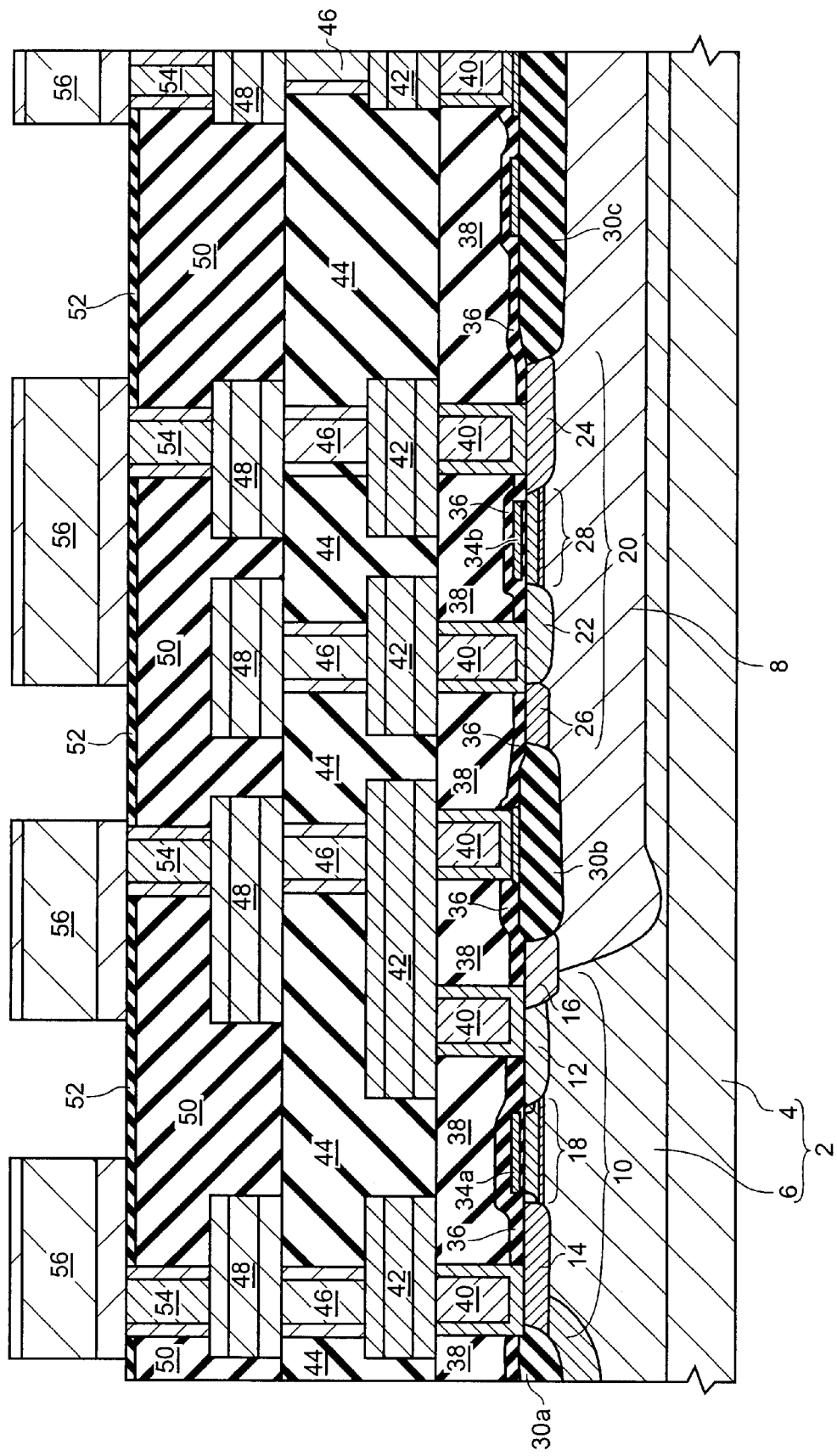

With reference to FIG. 2, the formation of an upper-level wiring layer is described below. A second silicon oxide film 44, buried plugs 46, and a second wiring layer 48 are formed on the first silicon oxide film 38 and first wiring layer 42. The formation thereof can be performed in their fabrication process similar to the first silicon oxide film 38, buried plugs 40, and first wiring layer 42 stated above. Another manufacturing process can also be used when needed. The second silicon oxide film 44 thus formed has a thickness ranging from 500 to 2,000 nm whereas the second wiring layer 48 has a thickness ranging from 500 to 1,000 nm.

Next, a third silicon oxide film 50 is formed on the second silicon oxide film 44 and second wiring layer 48. The third silicon oxide film 50 is formed by CVD to a thickness ranging from 500 to 2,000 nm. Subsequently, a silicon nitride film 52 is formed on the third silicon oxide film 50. Via holes are formed in the third silicon oxide film 50 and silicon nitride film 52 so as to reach the underlying second wiring layer 48. These via holes are formed by photolithography and dry etching methods. Buried plugs 54, such as tungsten (W), are formed in thus formed via holes. As in the case of forming the contact holes stated above, prior to forming the buried W plugs, a TiW film may be formed on the bottom and side surfaces of the respective contact holes. After the formation of the buried plugs 54, the silicon nitride film 52 and buried plugs. 54 be planarized in a CMP method.

Subsequently, a third wiring layer 56 is formed on thus planarized second silicon nitride film 52. The third wiring layer 56, which is not limited thereto, may have a structure similar to that of the first wiring layer 42. The third wiring layer 56 has a thickness ranging from 500 to 2,000 nm, for example.

Figure 3:
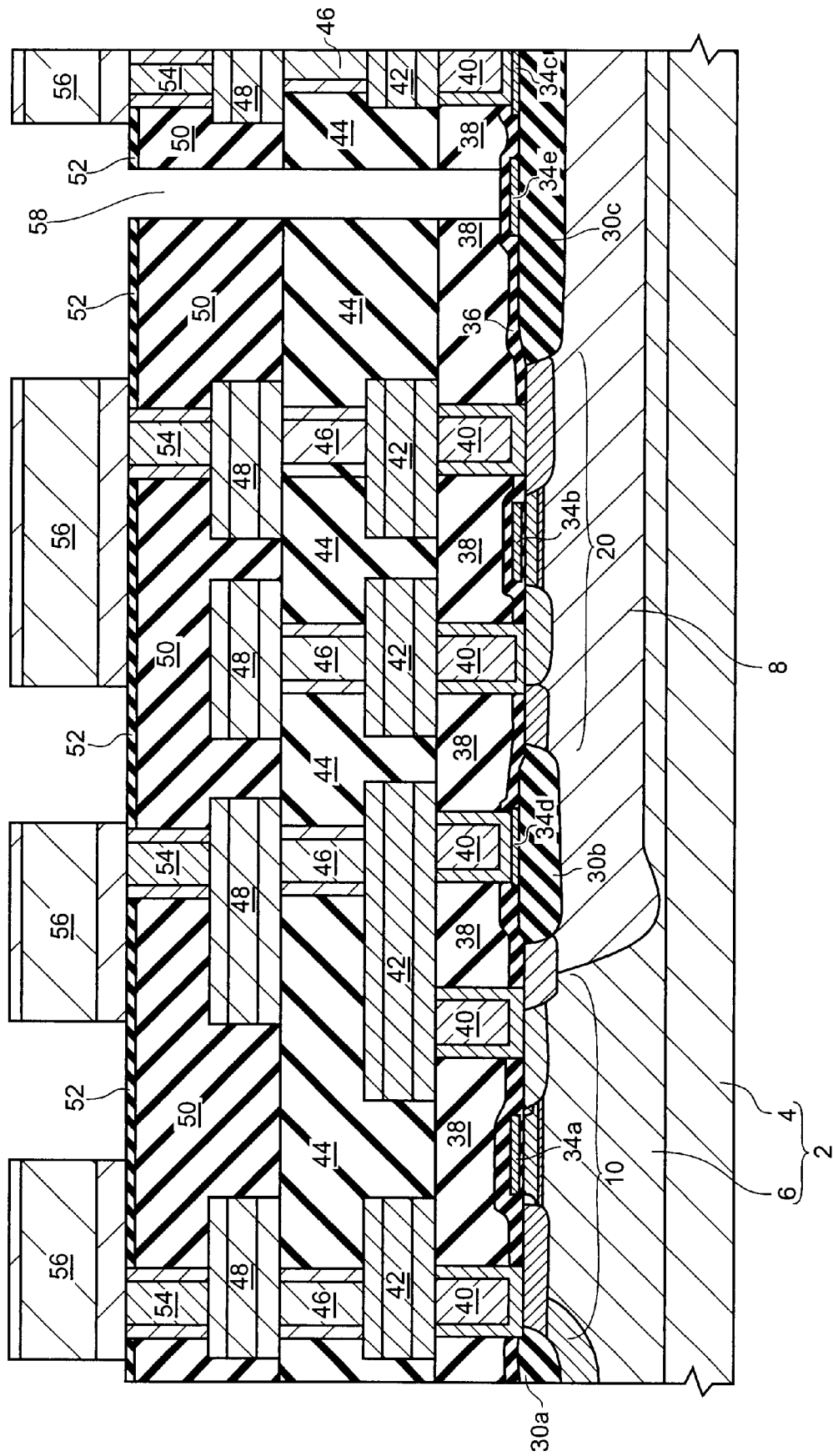

With reference to FIG. 3, a process step for forming an opening will be set forth below. An opening 58 is formed so as to reach the first silicon nitride film 36. The opening 58 is formed in the second region different from the first region in which the first to third wiring layers 42, 48, 56 and buried plugs 40, 46, 54 are formed.

In order to forming the opening 58, a mask layer having a specified hole is formed using a photolithography method. The silicon nitride film 52 is etched using the mask layer as an etching mask. Then, the silicon oxide films 38, 44, 50 are etched, such that the opening 58 reaches the first silicon nitride film 36. This etching process is performed under a specific condition of a low etching ratio of the first silicon nitride film 36 with respect to the silicon oxide films 38, 44, 50. As far as this condition of the etching ratio is satisfied, dry etching and wet etching techniques can be used. In case this condition of the etching ratio is satisfied, the opening 58 can be prevented from reaching the device isolation film 30a to 30c even when a certain degree of overetching occurs. Furthermore, a dummy gate electrode 34e may be disposed in a specified region in which the opening 58 is to be formed. The dummy gate electrode 34e allows higher process margin against overetching. The opening 58 shown in FIG. 3 has been formed through dry etching.

Figure 4:
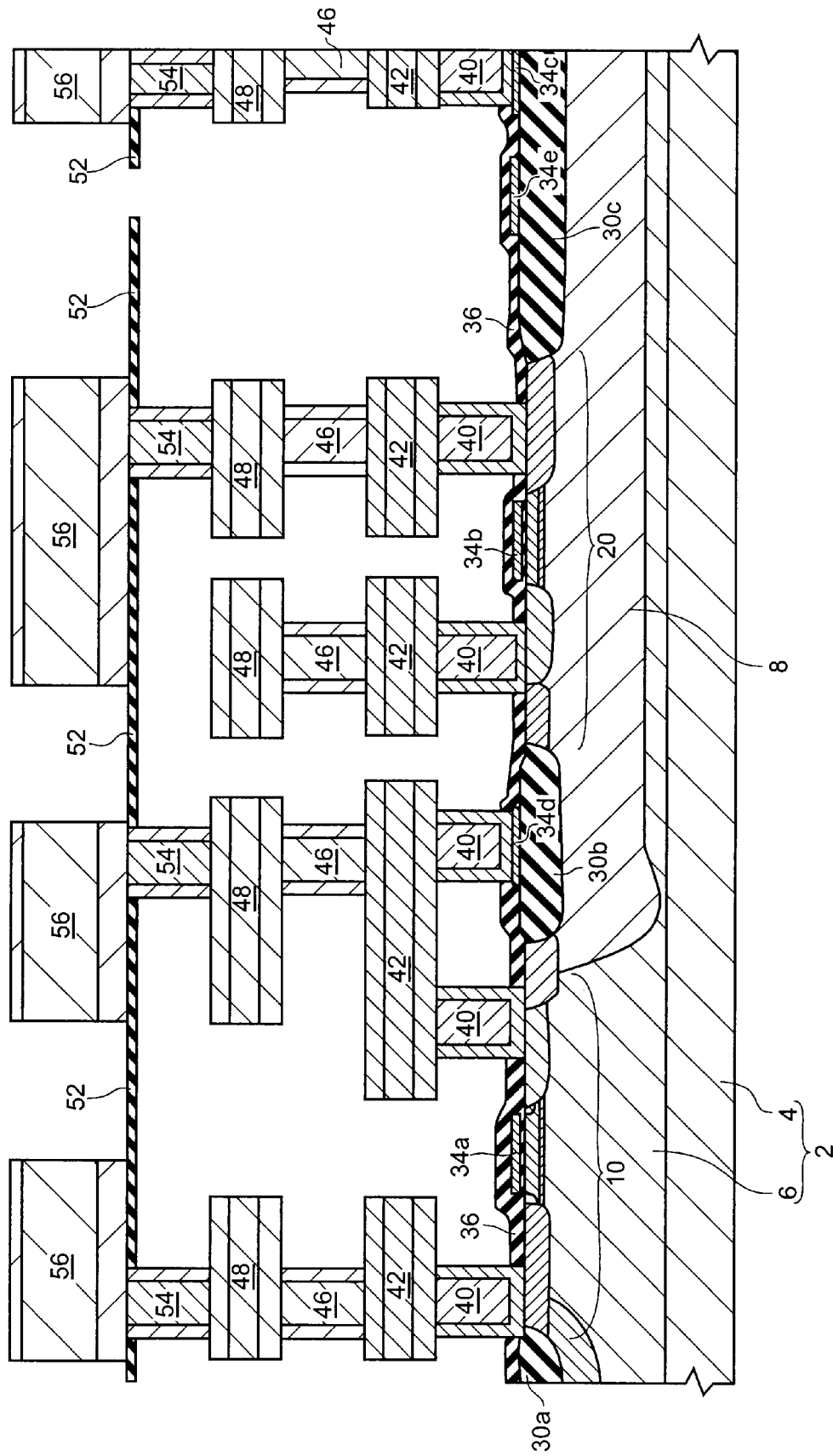

The substrate 2 with thus formed opening 58 is put in a chemical solution that includes hydrogen fluoride acid as a constituent element. This etching process results in the removal of the interlayer films 38, 44, 50 containing silicon oxide. FIG. 4 is cross-sectional view showing the resulting device structure with these silicon-oxide interlayer films 38, 44, 50 removed away. Preferred solutions for use in removing the silicon oxide films 38, 44, 50 are as follows: for example, hydrogen fluoride (HF) acid and buffered hydrofluoric acid (BOE) containing ammonium fluoride. With the use of these solutions, the process conditions of etching-away the oxide films at room temperatures, e.g. in a range of 20 to 25° C., can be adjusted in the etching duration time of and/or the etchant concentration.

The opening 58 may be a hole or groove provided so as to reach the underlying first silicon nitride film 36.

The first silicon nitride film 36 works as an etching stopper layer for protecting the NMOS device 10 and PMOS device 20. In addition, the buried plugs 40, 46, 54 and wiring layers 42, 48, 56 are made of respective materials that cannot be etched by the etching solution above. Alternatively, these buried plugs 40, 46, 54 and wiring layers 42, 48, 56 have respective parts thereon, exposed to the etching solution, which are made of materials resistant to the etching solution. These configurations prevent the electrical characteristics degradation of the NMOS/PMOS devices 10, 20, buried plugs 40, 46, 54 and wiring layers 42, 48, 56 even when the etching is carried out in time sufficient to permit the etching treatment of the silicon oxide films 38, 44, 50.

A passivation film, such as a plasma silicon nitride (p-SiN) film, plasma silicon oxide (p-SiO) film and plasma silicon oxide nitride (p-SiON) film, may be formed on the silicon nitride film 52 and third wiring layer 56.

Figure 5:
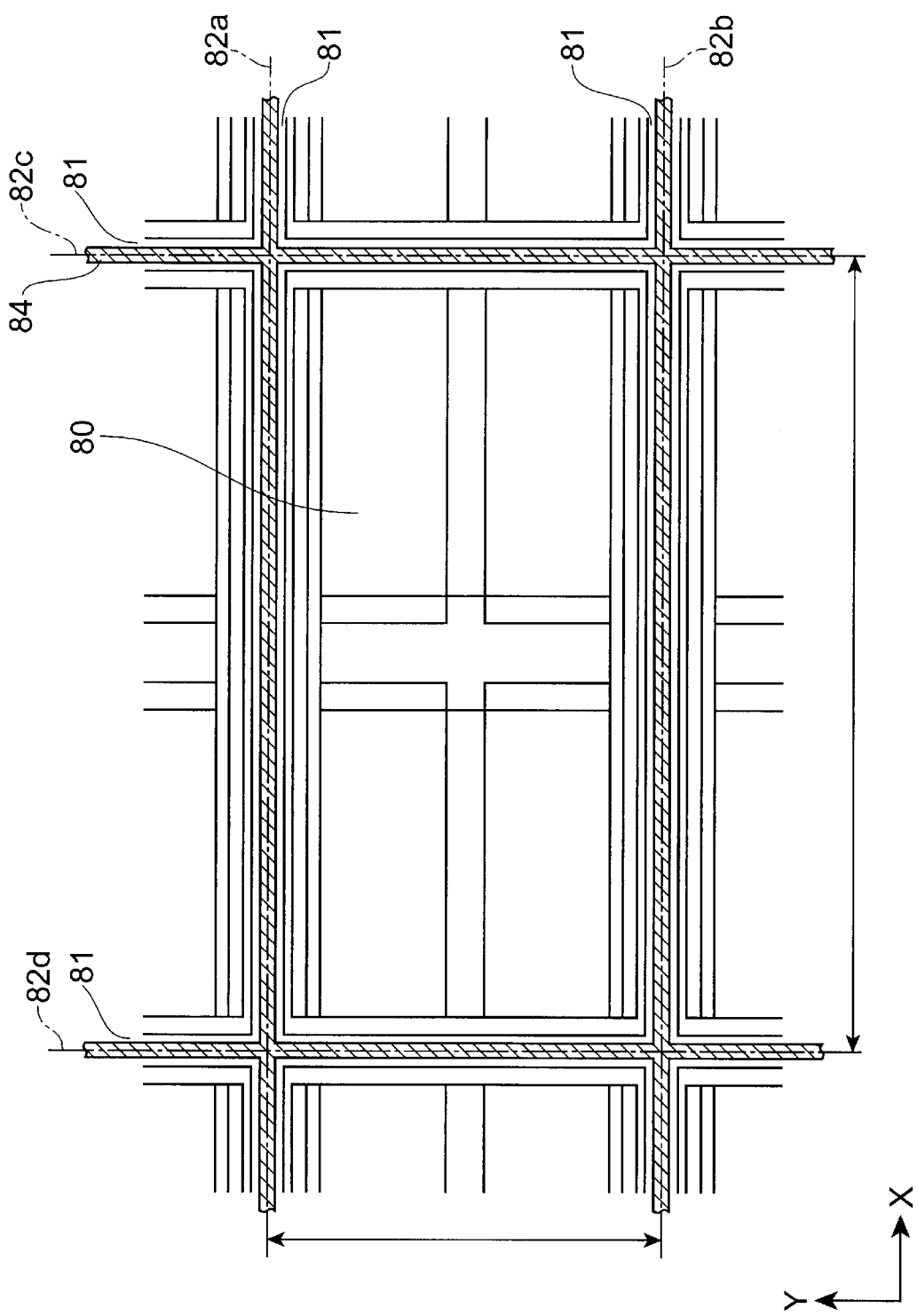
FIG. 5 is a plan view showing dynamic random access memory (DRAM) semiconductor chips formed on a wafer.
Figure 6:
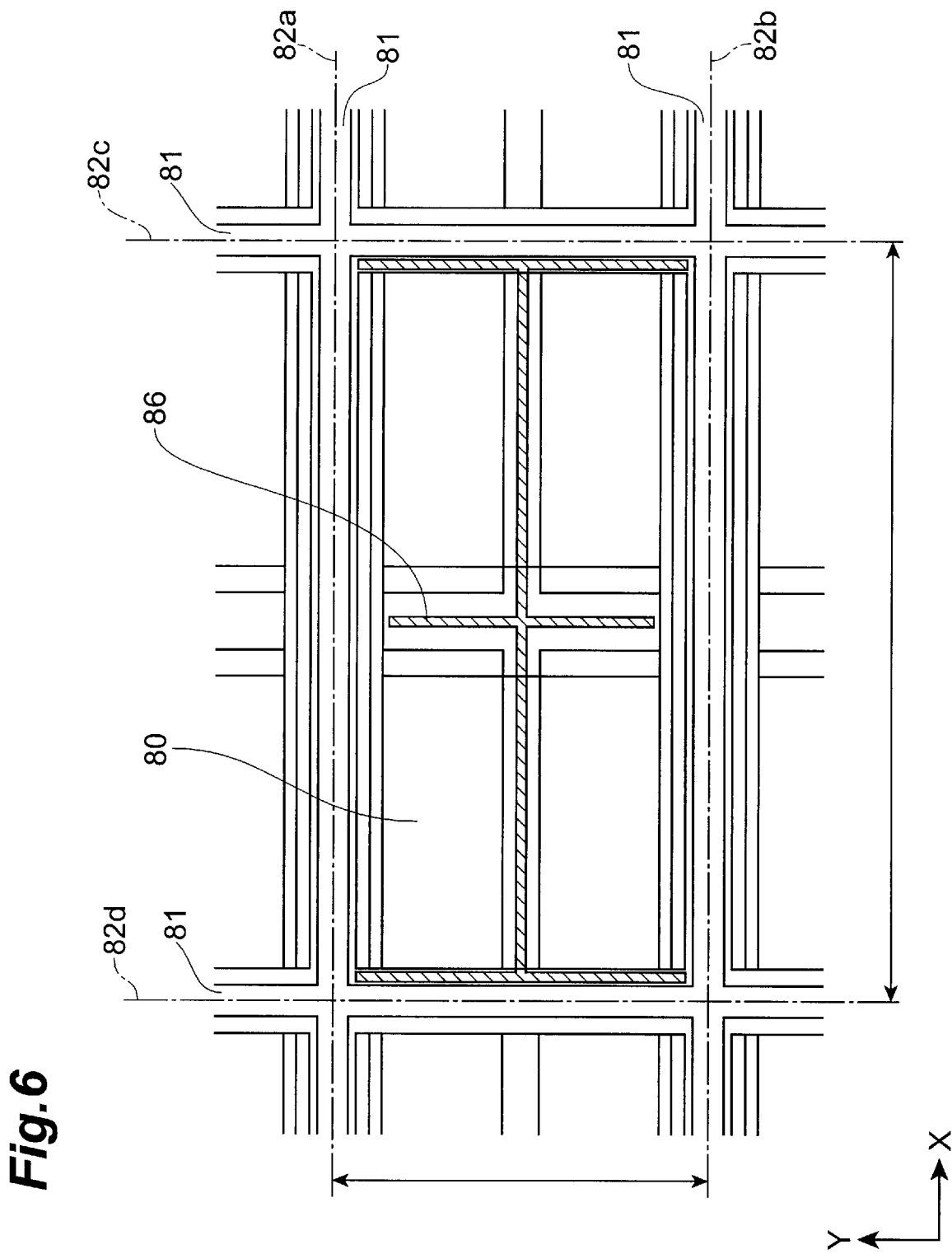
FIG. 6 is a plan view showing other dynamic random access memory (DRAM) semiconductor chips formed on a wafer.

FIGS. 5 and 6 show respective partial plan views of semiconductor chips of dynamic random access memory (DRAM) as fabricated on the wafer. In each drawing, a scribe region 81 surrounds the DRAM chip 80 on the four sides thereof. The size of the DRAM chip in Y direction is defined as the distance between the center lines 82a and 82b of the scribe region 81. On the contrary, the size of the DRAM chip in X direction is defined as the center lines 82c and 82d of the scribe region 81.

The opening 58 can be formed in the hatched regions of the FIGS. 5 and 6. Referring to FIG. 5, a hatched region 84 is provided in the scribe regions 81. Alternatively, referring to FIG. 6, a hatched region 86 is provided inside the DRAM chip. In this hatched region 86, no electrical interconnection is formed. In FIG. 6, the hatched region 86 is composed of three longitudinal portions and a single transverse portion. The single transverse portion extends along the longer sides of the DRAM chip in the center thereof. The three longitudinal portions extend along the shorter sides of the DRAM chip.

Although FIGS. 5 and 6 show some exemplary regions each for use as the second region, the second region is defined as the region that is different from the first region having the second conducting portion formed therein. Accordingly the second region shown in FIGS. 5 and 6 are depicted for exemplification purposes only.

FIGS. 7 to 11 show a second embodiment in accordance with the present invention.

Figure 7:
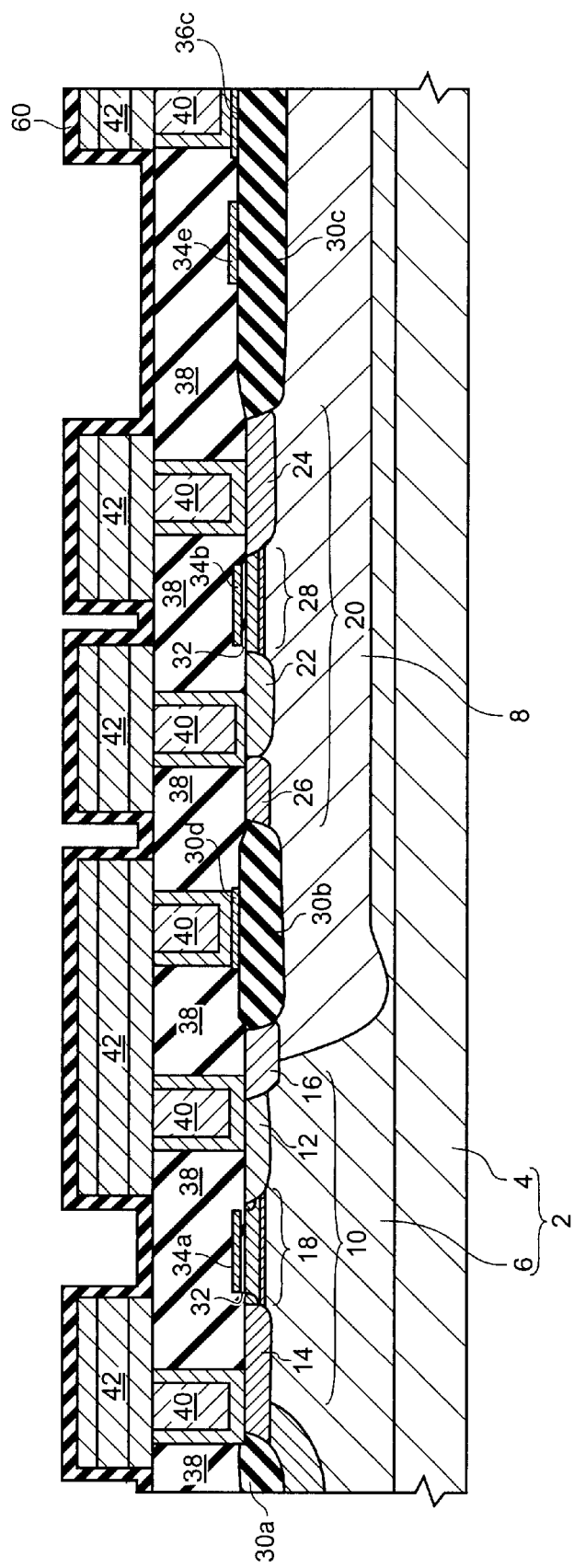
FIGS. 7 to 11 are cross-sectional views showing respective process steps of manufacturing a semiconductor integrated circuit in accordance with a second embodiment of the present invention.

Referring to FIG. 7, a silicon substrate 2 has a P-type epitaxial layer 6 on a P$^+$-type wafer 4. On the substrate 2, an NMOS device 10 and a PMOS device 20 are formed. These NMOS and PMOS devices 10, 20 have respective structures similar to those shown in FIG. 1. The second embodiment has manufacturing process steps identical to those of the first embodiment, that is, forming first silicon oxide film 38, buried plugs 40, and first wiring layer 42 as stated above, except for the process step of forming first silicon nitride film 36. These components are denoted by the same reference numerals as those in the first embodiment without their repeated description.

A third silicon nitride film 60, such as Si$_3$N$_4$, is formed so as to cover first wiring layer 42 and first silicon oxide film 38 therewith. In this embodiment, the third silicon nitride film 60 has the same functionality as that of the first silicon nitride film 36 in the first embodiment. The third silicon nitride film 60 is not, however, disposed between the first wiring layer 42 and NMOS/PMOS devices 10, 20. Preferably, the third silicon nitride film 60 is formed by a CVD method to a thickness ranging from about 50 to 100 nm.

Figure 8:
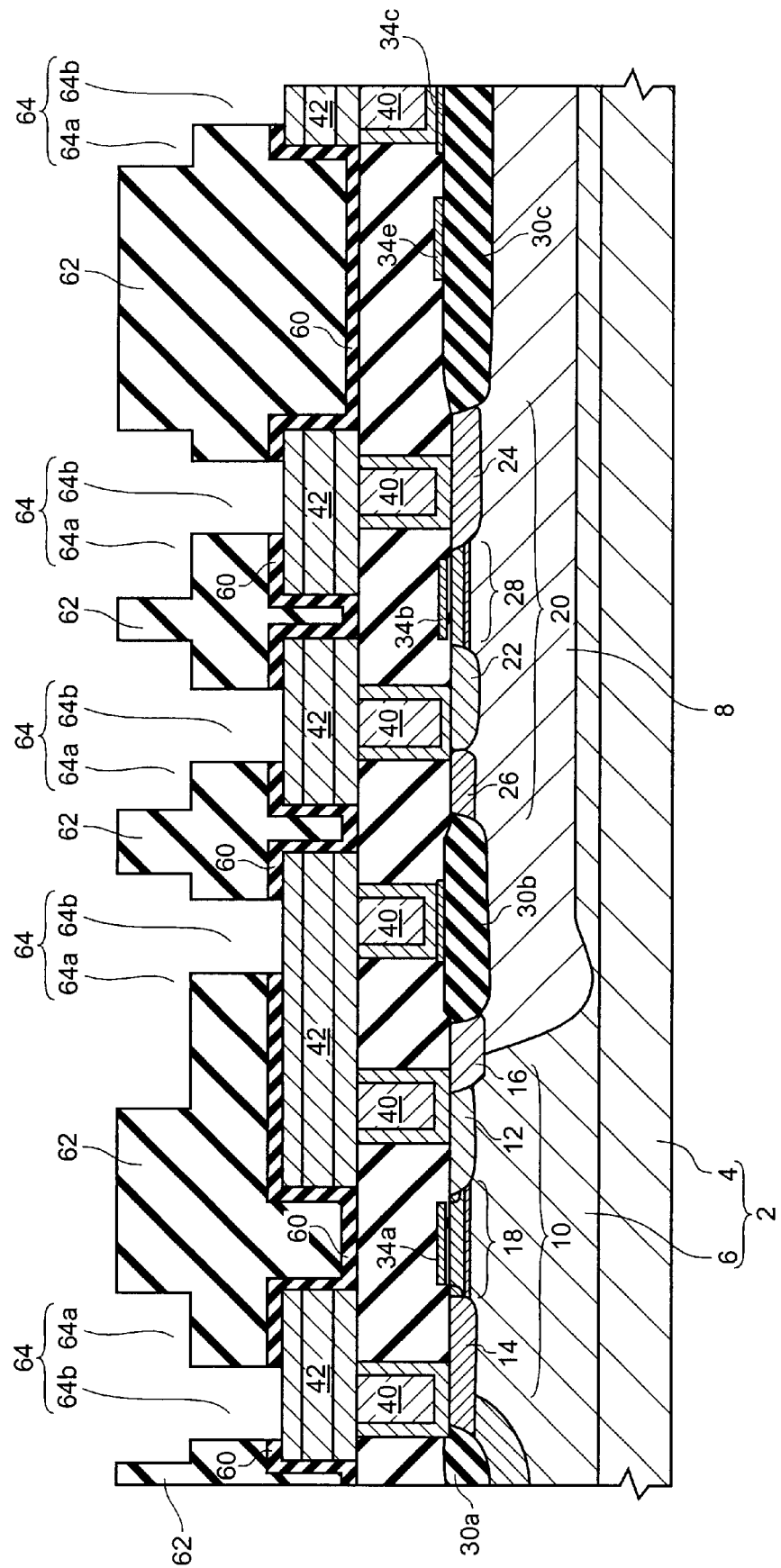

Referring to FIG. 8, a fourth silicon oxide film 62 is deposited on the third silicon nitride film 60. In this embodiment, since the interconnecting wires and interconnecting via plugs are formed by a dual damascene method, the fourth silicon oxide film 62 should have its thickness greater than a total height of the first wiring layer 42 and the via plugs. The fourth silicon oxide film 62 is typically formed by a CVD method to a thickness ranging from 500 to 2,000 nm. Note that a single-damascene method can be also applied to the present invention.

Depressed portions 64a are formed in fourth silicon oxide film 62 by photolithography and dry etching techniques. In the depressed portions 64a, a fourth wiring layers 66a will be formed. Since these depressed portions 64a will be filled with conducting material in a later process step, the depressed portions 64a should have respective their shapes that reflect the thickness and width of a wiring layer 66a. Next, depressed portions 64b are also formed by photolithography and dry etching methods in specified locations in which via plugs 66b connecting first wiring layer 42 with fourth wiring layer 66a will be formed. Since the depressed portions 64b will be filled with conducting materials in the same process step of forming the depressed portions 64a in later process, the depressed portions 64b have respective shapes that reflect the height and aperture size of interconnecting via plugs 66b. Each depressed portion 64b is formed so as to reach the top of first wiring layer 42. For instance, the depressed portions 64a have depth ranging from approximately 500 to 1,000 nm while the depressed portions 64b also have depth ranging about 500 to 1,000 nm. Optionally, a silicon nitride film may be formed at the position corresponding to the interface between the depressed portions 64a and 64b, so that the fourth silicon oxide film 62 is composed of two silicon oxide layers. This allows the excellent controllability of the depressed portion depth.

Figure 9:
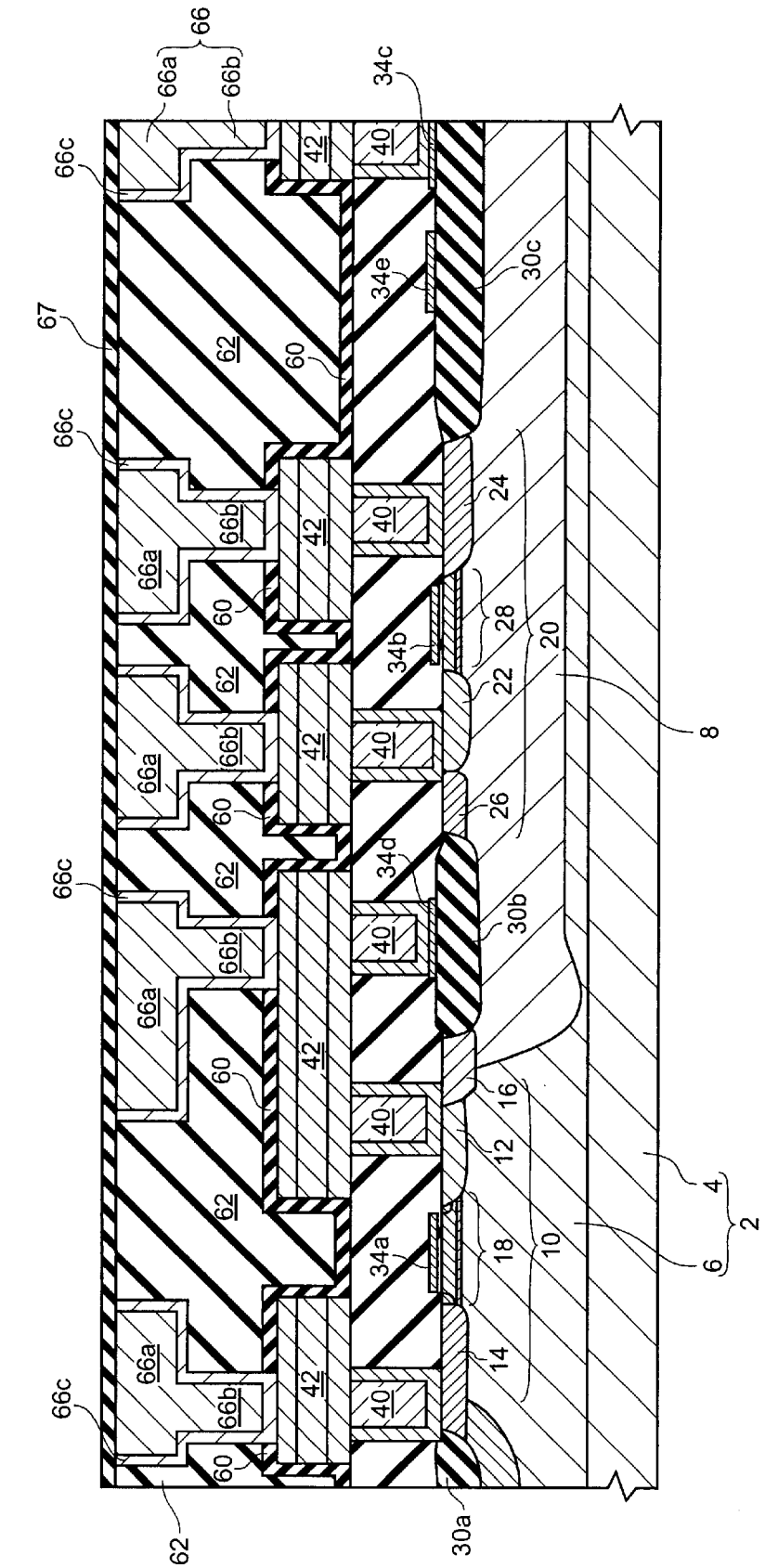

Referring to FIG. 9, the depressed portions 64a and 64b are buried with conducting material. Preferably this burying process step is carried out in the following manner. First, a first conducting layer 66c, that is, a diffusion barrier layer or adhesive layer such as TaN or TaSiN, is formed on the entire surface of the underlying film. The first conducting layer 66c is formed by sputtering, for example, to a thickness ranging from about 30 to 100 nm. The first conducting layer 66c is deposited on the bottom and side surfaces of depressed portions 64a and 64b. Then, the depressed portions 64a and 64b are filled with conducting material such as copper (Cu) to form a second conducting layer 66a therein. The Cu conductor is deposited, for example, by sputtering to form a seed layer with a thickness ranging from about 50 to 100 nm, and then is formed thereon by electrolytic plating technique to form the film with a desired thickness ranging from about 1 to 5 micrometers ($\mu$m). Preferably, the resultant conducting film has a thickness sufficient to allow depressed portions 64a and 64b to be fully filled with buried material and to allow the successful planarization in later process steps. Although the fourth wiring layers 66a and interconnecting via plugs 66b are shown in the figures as if they are formed in respective process steps and are individual members due to their functionality, it would be apparent from the foregoing description that the fourth wiring layers 66a and interconnecting via plugs 66b are formed together at the same step to form conducting members 66.

As shown in FIG. 9, the fourth silicon oxide film 62 and first conducting members 66 thus formed are then planarized by a CMP method, for example. A thin silicon nitride film 67 maybe formed on thus planarized fourth silicon oxide film 62 and first conducting members 66.

Figure 10:
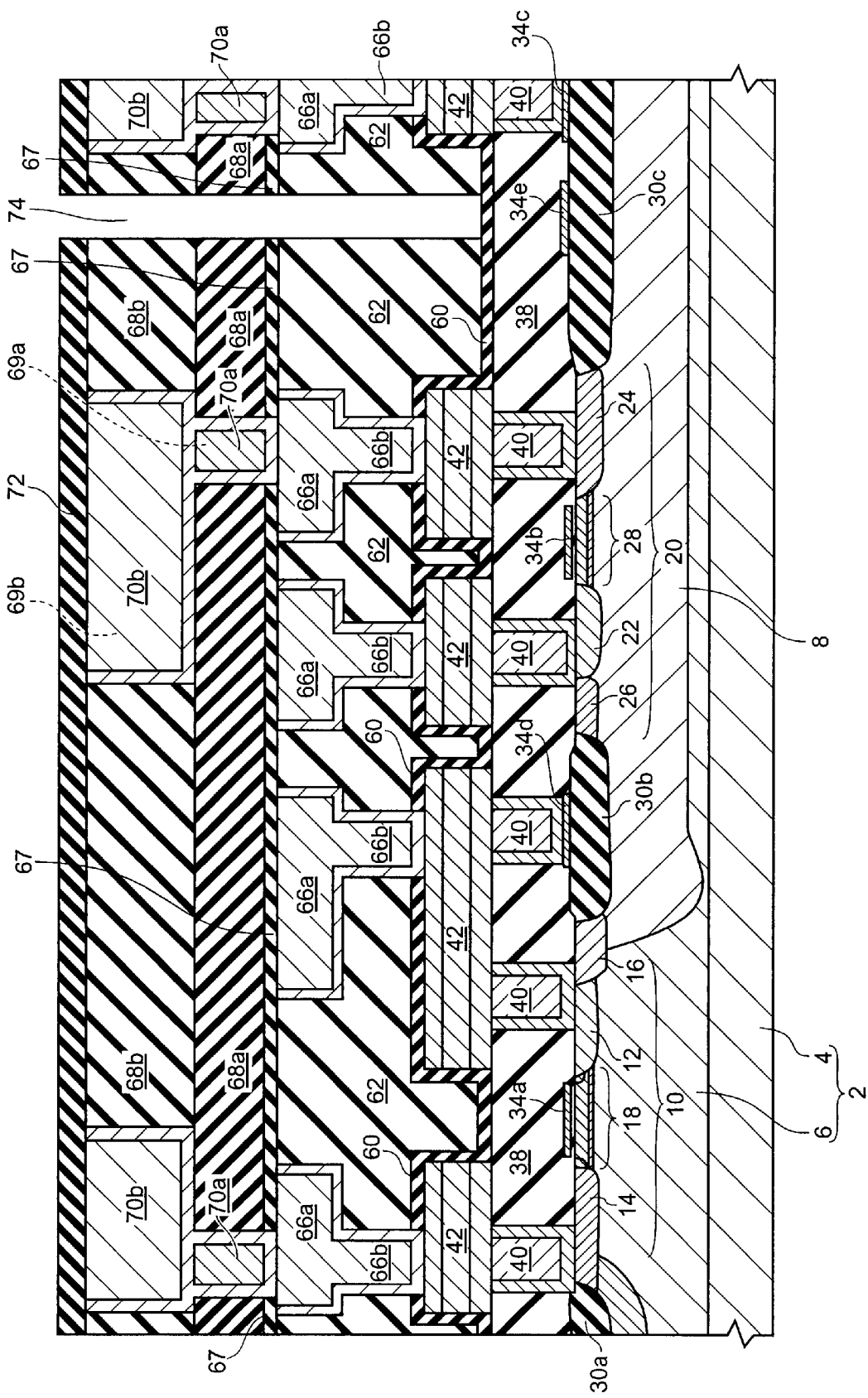

Referring to FIG. 10, second conducting members 70a are formed by a single-damascene method in a fifth silicon oxide film 68a. The fifth silicon oxide film 68a may be formed on the silicon nitride film 67 through a process step similar to that of the fourth silicon oxide film 62 discussed above. Then, in the fifth silicon oxide film 68a, depressed portions 69a are formed in selected locations in which second conducting members 70a will be formed later. The depressed portions 69a are formed by selectively etching away the silicon nitride film 67 using photolithography and dry etching techniques so as to reach its associated conductors 66a. The second conducting members 70a may be formed in depressed portions 69a in a process step similar to that of the first conducting members 66. Thus formed fifth silicon oxide film 68a and second conducting members 70a are then planarized by a CMP method, for example.

Subsequently, third conducting members 70b are formed in a sixth silicon oxide film 68b by a single-damascene method. The sixth silicon oxide film 68b and third conducting members 70b may be formed in respective process steps similar to those of the fifth silicon oxide film 68a and second conducting members 70a described above, and the detailed description of the sixth silicon oxide film 68b and third conducting members 70b will be eliminated herein. The sixth silicon oxide film 68b and third conducting members 70b may, however, have their respective structures different from those of the fifth silicon oxide film 68a and second conducting members 70a, and may also be formed in respective process steps different from that of the fifth silicon oxide film 68a and second conducting members 70a.

Referring to FIG. 10, the planarized sixth silicon oxide film 68 and second conducting members 70 are shown. On the surfaces of them, a fourth silicon nitride film 72 is formed. The fourth silicon nitride film 72 may be formed in a CVD method to a thickness ranging from about 50 to 100 nm, for example.

The formation of an opening will be described below with reference to FIG. 10. An opening 74 is formed so as to reach the third silicon nitride film 60. The opening 74 is disposed in the second region different from the first region in which the first and second conducting portions 66, 70 are provided.

In order to form the opening 74, a mask layer having a predetermined hole is formed using a photolithography method. The silicon oxide films 62, 68 and silicon nitride film 76 are etched using this mask layer as an etching mask until the resultant etched-away portion reaches the silicon nitride film 60. This etching is carried out to selectively remove away the silicon oxide films 62, 68 under an etching condition that the etching rate of the silicon oxide films 62, 68 is higher than that of the third silicon nitride film 60. As far as this condition is satisfied, a dry etching or wet etching technique can be used. If this condition is satisfied, the opening 74 will not reach the first silicon oxide film 38 and the device isolation film 30a to 30c even when a certain degree of overetching occurs. The opening 74 shown in FIG. 10 is formed by dry etching.

Figure 11:
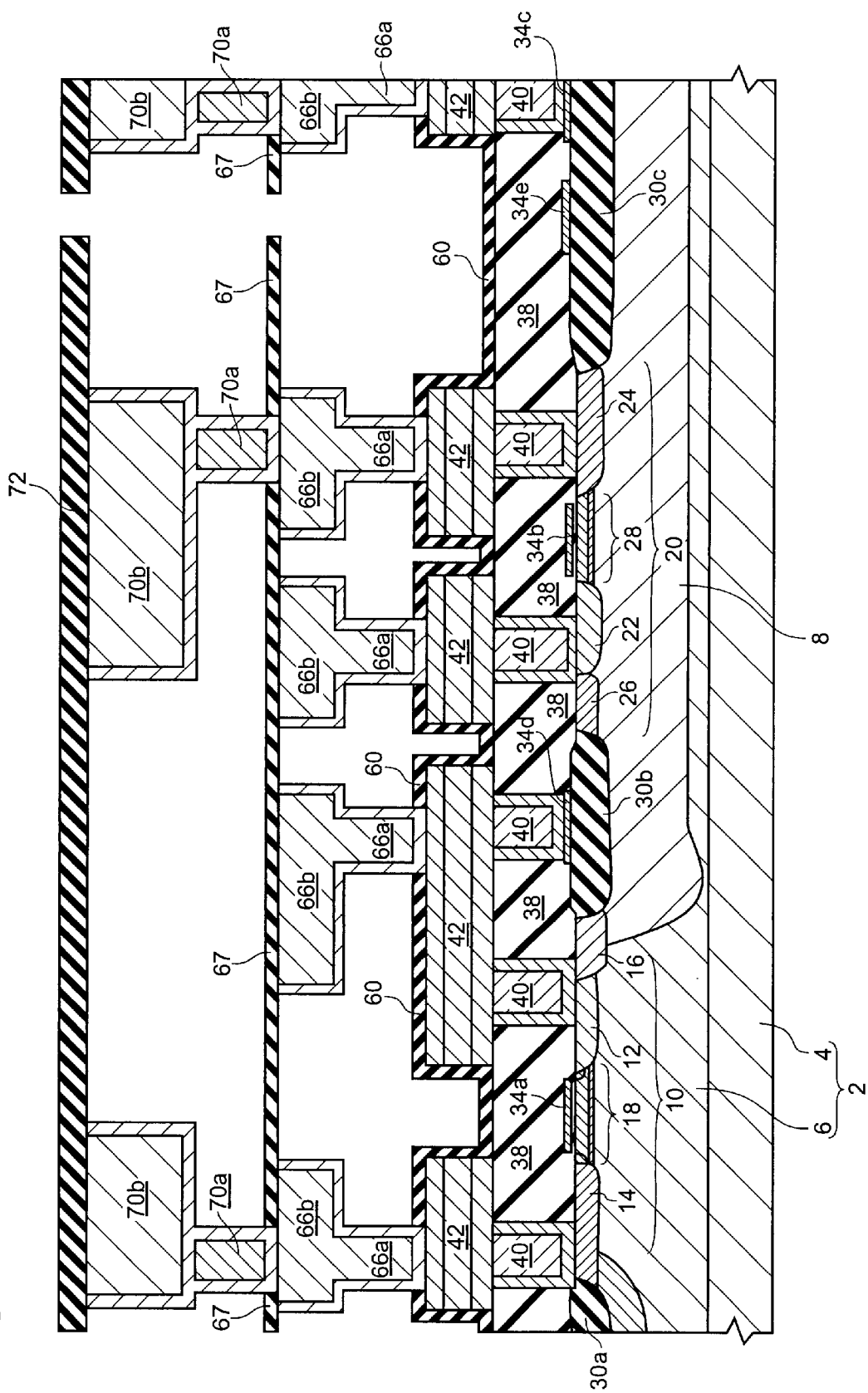

The substrate 2 and the interlayer dielectric film portion with thus formed opening 74 are put in a hydrogen fluoride acid etching solution. The interlayer film portion includes silicon oxides 62, 68, and the silicon oxides 62, 68 is removed. FIG. 11 shows a cross-sectional view in a process step after these oxide films 62, 68 are removed away. As in the first embodiment stated above, the opening 74 may be a hole or groove formed so as to reach the fourth silicon nitride film 60.

The third silicon nitride film 60 also serves as an etching stopper film for protecting the NMOS device 10 and PMOS device 20 in this embodiment, as described in the first embodiment. The second conducting portions 66, 70a, 70b may be made of material resistant to the etchant. Alternatively, these conducting members 66, 70 (70a, 70b) may be covered with material resistant to the etchant on its surface exposed to the etchant. These configuration can prevent the degradation in the electrical characteristics of the NMOS/PMOS devices 10, 20, first silicon oxide film 38, buried plugs 40 and wiring layer 42 even when the wafer is exposed to the etchant for time sufficient to etch these silicon oxide films 62, 68.

Although a silicon nitride film is used as an etching stopper film in the above explanation, the etching stopper film is not limited to such a silicon nitride film. Other examples of the etching stopper film are listed as follows: a silicon nitride film, a SiC film, and an amorphous SiC:H (α-SiC:H) film, and a multilayer film comprising at least one of them. When the etchant is used to etch the interlayer film portion including silicon oxides, the etching stopper film exhibits an etching rate less than that of the silicon oxide film.

One important feature of the second embodiment is that the conducting layer 42 at the lowest wiring level may be disposed independently of the location of the opening 74. This conducting layer 42 can be utilized as a wiring level for electrical connecting the semiconductor devices, such as NMOS/PMOS devices 10, 20, with each other. Since the wiring layer 42 is surrounded by the silion dielectric films as described above, this causes a certain amount of wiring capacitane to the, wiring layer 42. Fortunately, such capacitance causes less degradation of the speed performance of NMOS/PMOS devices 10, 20 as long as the wiring layer 42 is used for electrical connection between these semiconductor devices adjacent to each other. Since the lowermost conducting layer 42 can be provided independently of the location of opening 74, further restriction on the interconnections does not occur in the semiconductor integrated circuits.

In the second embodiment, the first conducting portion are provided beneath the third silicon nitride film 60 acting as the etching stopper layer whereas the second conducting portion is provided on the silicon nitride film 60.

Figure 12:
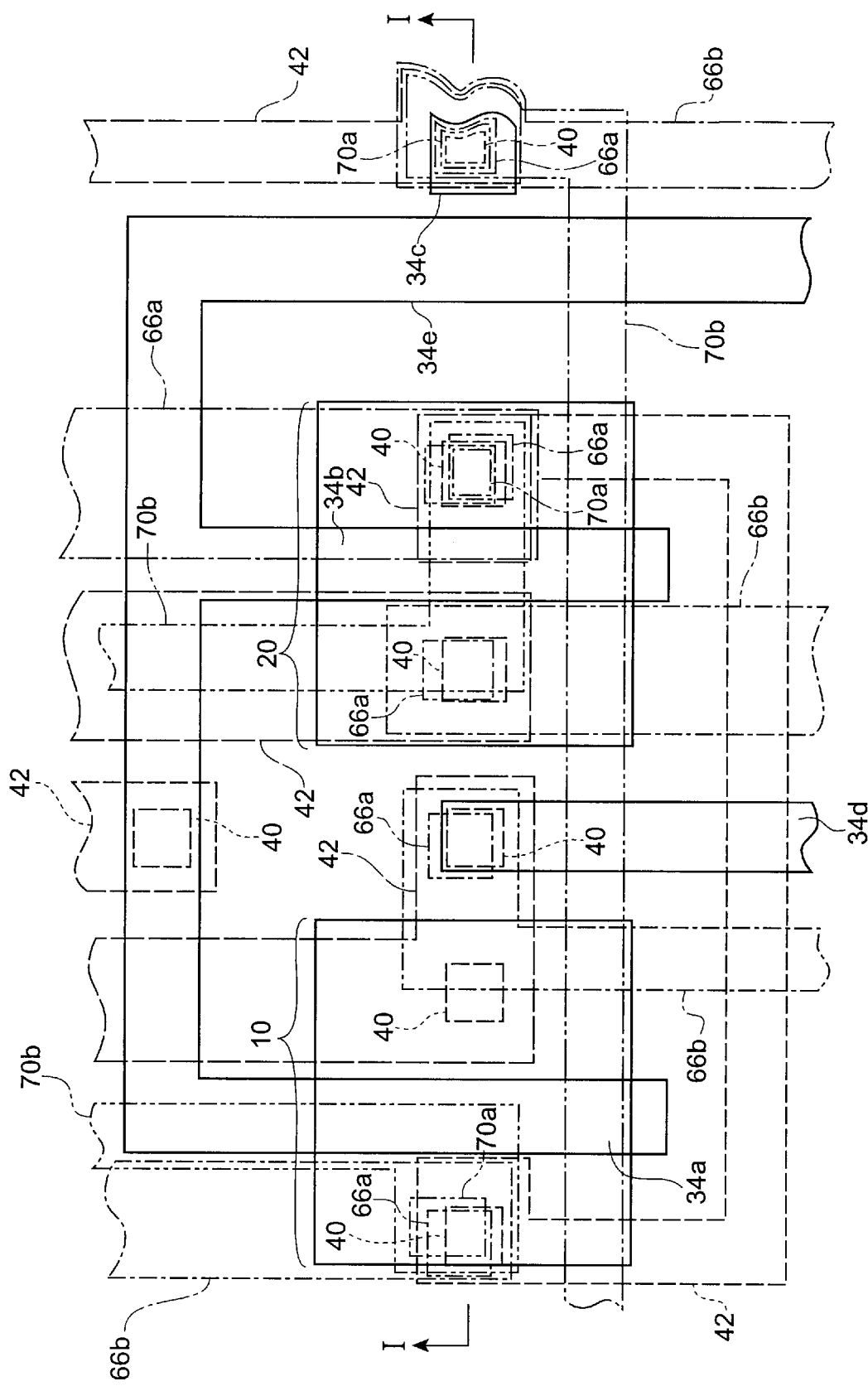
Figure 13:
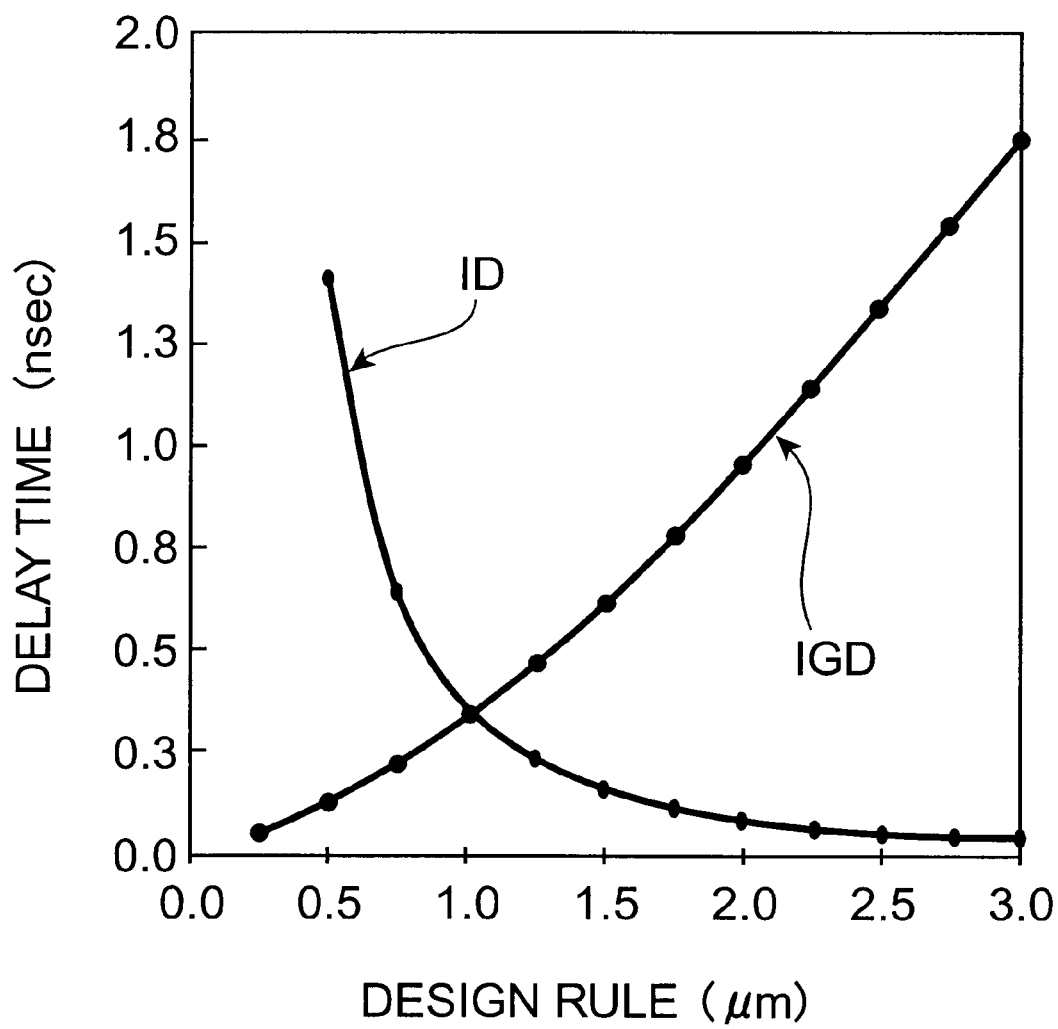
FIG. 13 is a characteristic drawing showing the operation speed of typical semiconductor integrated circuits.

FIG. 12 is a plan view of the integrated circuit device structure shown in FIG. 11, which shows its cross-section taken along line I—I of FIG. 12. As shown in FIG. 12, each of the buried plugs 40 included in the first conducting portion has a rectangular shape, and the first wiring layer 42 included in the first conducting portion extends along a plane so as to cover the buried plugs 40 therewith. The interconnecting via plugs 66b and via conductors 70a, included in the second conductor portion, also have rectangular shapes, and the fourth wiring layers 66a and third conducting members 70b, included in the second conductor portion, extend along a plane as to cover interconnecting via plugs 66b and via conductors 70a therewith, respectively.

Although the first and second embodiments stated above are specifically directed to the semiconductor integrated circuit having metal-insulator semiconductor field effect transistors (MISFETS), such as MOS transistors, the present invention should not exclusively be limited thereto. The invention may also be applied to other semiconductor integrated circuits having bipolar transistors in place of or in addition to these MISFETs.

In the present invention, the silicon oxide film portion disposed on and above the silicon nitride film is removed. This allows the selection of wiring levels with smaller capacitance depending on the portion in which the etching stopper layer is disposed.

In accordance with the method of manufacturing a semiconductor integrated circuit incorporating the principles of the present embodiments, the method is specifically arranged to include the steps of: forming an etching stopper layer over the semiconductor devices on a substrate; forming more than one layer of conducting members and silicon oxide interlayer dielectric films on the etching stopper layer; and then forming an opening in the a silicon oxide interlayer dielectric film so as to reach the etching stopper layer. The substrate with the opening formed therein is etched in hydrogen fluoride etchant to remove away the silicon oxide interlayer dielectric film. As the silicon oxide interlayer dielectric portion is etched using the etchant, electrical interconnecting wiring portions are thus formed which are not in contact with any silicon oxides. The etching stopper layer works as a protective film with respect to this etching treatment. So, the semiconductor devices are well protected against the etching. In addition, since the opening for etching is provided in the above-identified second region on the substrate, it is possible to form the opening so as to reach the etching stopper layer independently of that conducting portion on the substrate. As the interlayer dielectric film portion is exposed on the bottom and side surfaces of thus formed opening, etching process progresses sequentially from the side surface of such interlayer film portion at any given depths of the opening.

Consequently, it is possible to provide the method of manufacturing a semiconductor integrated circuit allowing its enhanced speed performance without employing any new process apparatus or facility.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of manufacturing a semiconductor integrated circuit having, on a substrate, conductors for electrical connection of a plurality of semiconductor devices, said substrate having a first region and a second region different from said first region, said method comprising steps of:

forming a plurality of semiconductor devices on a substrate;

forming an etching stopper film on said plurality of semiconductor devices;

forming a first conducting portion for connecting said plurality of semiconductor devices with each other;

forming, on said etching stopper film, an interlayer dielectric film portion and a second conducting portion for connection of said first conducting portion in said first region, said interlayer dielectric film portion containing silicon oxide;

forming an opening in said second region through said interlayer dielectric film portion; and etching said interlayer dielectric film portion having said opening formed therein in an etching solution containing at least hydrogen fluoride acid therein to remove said interlayer dielectric film portion.

2. The method as recited in claim 1, wherein said step of forming a first conducting portion comprises the step of forming contacting conductors directly connected to said semiconductor devices and wiring conductors connected to said contacting conductors, and wherein said first conducting portion includes said contacting conductors and said wiring conductors.

3. The method as recited in claim 1, wherein said step of forming, on said etching stopper film, a second conducting portion includes the step of forming one or more wiring conductors, a silicon oxide film on each of said wiring conductors and said first conducting portion, and via conductors in said silicon oxide film, and wherein said second conducting portion includes said wiring conductors and said via conductors; and wherein said interlayer dielectric film portion includes said silicon oxide films.

4. The method as recited in claim 3, wherein said wiring conductors contain copper as its main constituent material whereas said via conductors contain tungsten as its main constituent material.

5. The method as recited in claim 1, wherein said forming, on said etching stopper film, a second conducting portion comprises a step of forming said second conducting portion in said interlayer dielectric film using a damascene technique.

6. The method as recited in claim 1, wherein said substrate includes a semiconductor chip region including said semiconductor integrated circuit and a scribe region provided so as to surround said semiconductor chip region, and wherein forming an opening in said second region comprises a step of forming said opening in said scribe region.

7. The method as recited in claim 1, wherein said substrate includes a semiconductor chip region including said semiconductor integrated circuit and a scribe region so as to surround said semiconductor chip region, and wherein said step of forming an opening in said second region comprises a step of forming said opening in said semiconductor chip region.

8. The method as recited in claim 1, wherein said step of forming an etching stopper film comprises a step of forming said etching stopper film on said first conducting portion.

9. The method as recited in claim 1, wherein said step of forming a first conducting portion comprises a step of forming said first conducting portion through said etching stopper film so as to connect said semiconductor devices with each other.

10. The method as recited in claim 1, wherein said opening is at least one of a hole and a groove provided so as to reach said etching stopper film.

* * * * *